United States Patent
Chang

[19]

[11] Patent Number: 6,140,670
[45] Date of Patent: Oct. 31, 2000

[54] PHOTODIODE STRUCTURE HAVING MASK TO REDUCE LEAKAGE CURRENT

[75] Inventor: Tsun-Tsai Chang, Hsinchu, Taiwan

[73] Assignee: United Microelectronics Corp., Hsinchu, Taiwan

[21] Appl. No.: 09/128,366

[22] Filed: Aug. 3, 1998

[30] Foreign Application Priority Data

Apr. 18, 1998 [TW] Taiwan .................. 87105963

[51] Int. Cl.⁷ .......................... H01L 31/06; H01L 29/768
[52] U.S. Cl. ......................... 257/233; 257/435; 257/461
[58] Field of Search .................... 257/233, 435, 257/461

[56] References Cited

U.S. PATENT DOCUMENTS 4,717,945  1/1988  Yusa et al. ............................. 257/461

*Primary Examiner*—Minh Loan Tran
*Attorney, Agent, or Firm*—Thomas, Kayden, Horstemeyer & Risley

[57] ABSTRACT

The invention provides a photodiode structure having a first conductive type substrate and at least an isolation region, the photodiode structure comprising a doped second conductive type region, wherein the doped second conductive type region is formed in the substrate at a distance from the neighboring isolation region, and a mask layer covering at least a peripheral strip near the edge of the isolation region so that the doped second conductive type region is exposed.

6 Claims, 2 Drawing Sheets

PHOTODIODE STRUCTURE HAVING MASK TO REDUCE LEAKAGE CURRENT

CROSS-REFERENCE TO RELATED APPLICATION

This application claims the priority benefit of Taiwan application serial no. 87105963, filed Apr. 18, 1998, the full disclosure of which is incorporated herein by reference.

BACKGROUND OF THE INVENTION

1. Field of Invention

The present invention relates to a structure of a semiconductor device. More particularly, the present invention relates to a photodiode structure.

2. Description of Related Art

A photodiode is a light-sensitive semiconductor device having a P-N junction that coverts light into an electrical signal (also known as a photodetecting device). Due to the presence of an electric field at the P-N junction, electrons in the N-doped layer and holes in the P-doped layer cannot normally diffuse across the junction in the absence of light. However, when sufficient light falls on the P-N junction, electronhole pairs are generated by energy from the light. These electrons and holes are able to diffuse towards the junction. Due to the presence of an electric field at the junction, electrons will separate out towards the N-side and holes will separate out towards the P-side of the junction and accumulates there. Therefore, a current is able to flow across the P-N junction. Ideally, a photodiode should remain in open-circuit condition in the dark until light is shone on the junction.

In general, photodiode devices are used as imaging sensors in different types of equipment, for example, PC cameras and digital cameras. One major defect of a conventional photodiode is its relatively large junction leakage current. Junction leakage current often leads to the build-up of a large dark current in products that employ a large number of imaging sensors. Furthermore, the large dark current is capable of producing abnormal bright spots on imaging screen.

FIGS. 1A and 1B are cross-sectional views showing the progression of manufacturing steps in fabricating a conventional photodiode.

First, as shown in FIG. 1A, a patterned silicon nitride layer ($Si_3N_4$) 102 is formed over a substrate 100. The substrate 100 can be, for example, a P-type substrate or the P-well of an N-type substrate. The silicon nitride layer 102 is mainly used as a mask in a local oxidation of silicon (LOCOS) operation. Next, the LOCOS operation is carried out in an atmosphere filled with water vapor to form a field oxide (FOX) layer 104 on the substrate 100. In other words, an insulating barrier is formed surrounding a device region. Since water vapor and oxygen cannot easily penetrate a silicon nitride layer, silicon dioxide layer does not form in regions covered by the silicon nitride layer 102. Field oxide only forms in regions not covered by the silicon nitride layer 102. However, water vapor and oxygen still manage to get to the corner region below the silicon nitride layer 102 through horizontal diffusion. Therefore, peaked regions (also known as bird beaks) 106 are formed in the corner regions. In other words, a portion of the silicon layer next to the corner region of the silicon nitride layer 102 will be oxidized horizontally to different degrees.

Next, as shown in FIG. 1B, a wet etching method is used to remove the silicon nitride layer 102. Thereafter, an ion implantation is performed, implanting ions opposite in polarity to the heavily doped $P^+$ substrate 100. That is, the exposed substrate 100 region is heavily implanted using N-type ions to form a heavily doped $N^+$ region 110. Subsequently, the heavily doped $N^+$ region 110 is annealed to drive the implanted N-type ions deeper into the substrate interior. Consequently, a photodiode device is formed at the junction between the heavily doped $N^+$ region 110 and the substrate 100.

However, in a conventional photodiode device, bird's beak regions exist on the field oxide layer on each side of the device. Because stress in those regions is higher and crystal defects occur there more often than in other areas, a large junction leakage current is generated there. Therefore, imaging equipment that employs a large number of these photodiodes can pick up the leakage current to produce a large dark current that will result in the formation of abnormal bright spots on imaging screen.

In light of the foregoing, there is a need to provide a better photodiode structure.

SUMMARY OF THE INVENTION

Accordingly, the present invention provides a photodiode structure capable of lowering junction leakage current to about one-tenth of a conventional photodiode device and the method of this photodiode structure's manufacture. Therefore, the defects of convention photodiode sensors, in which the dark current is too large and abnormal, bright spots appear, can be eliminated.

To achieve these and other advantages and in accordance with the purpose of the invention, as embodied and broadly described herein, the invention provides a photodiode structure having a first conductive type substrate and at least an isolation region, the photodiode structure comprising a doped second conductive type region, wherein the doped second conductive type region is formed in the substrate at a distance from the neighboring isolation region, and a mask layer covering at least a peripheral strip near the edge of the isolation region so that the doped second conductive type region is exposed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
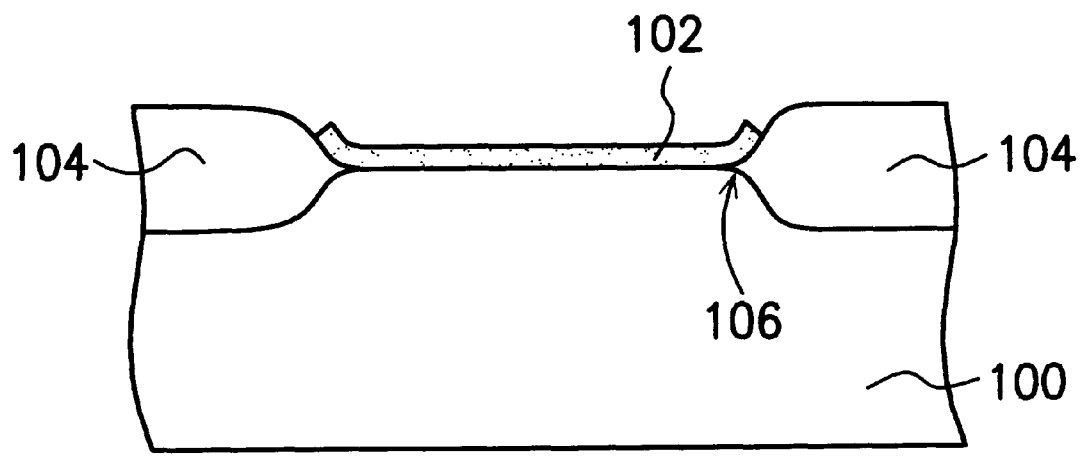
FIGS. 1A and 1B are cross-sectional views showing the progression of manufacturing steps in fabricating a conventional photodiode.
Figure 1B:
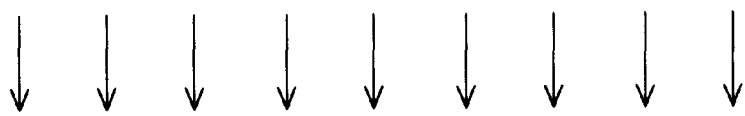
Figure 1B:
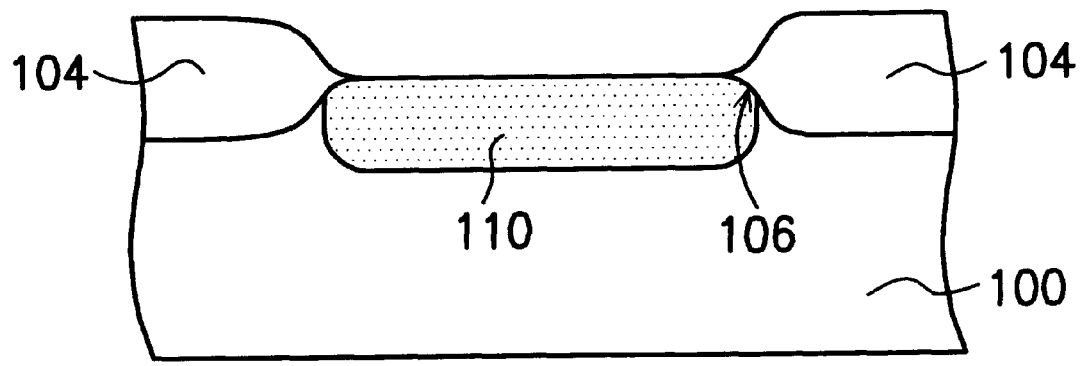

Reference will now be made in detail to the present preferred embodiments of the invention, examples of which are illustrated in the accompanying drawings. Wherever possible, the same reference numbers are used in the drawings and the description to refer to the same or like parts.

Figure 2A:
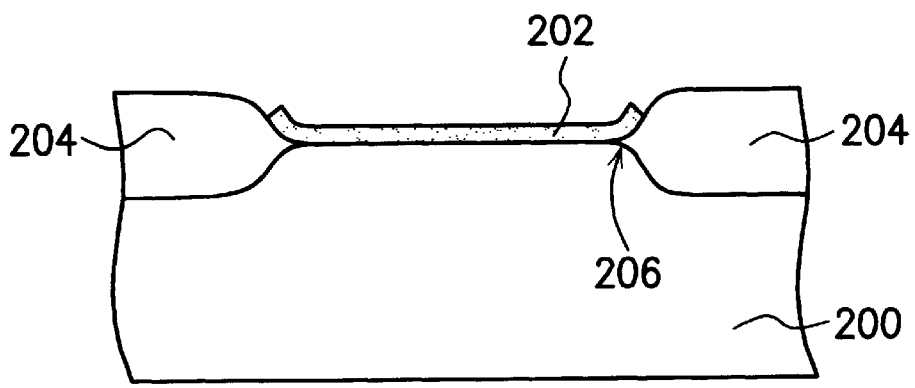
FIGS. 2A through 2C are cross-sectional views showing the progression of manufacturing steps in fabricating a photodiode according to one preferred embodiment of this invention.
Figure 2B:
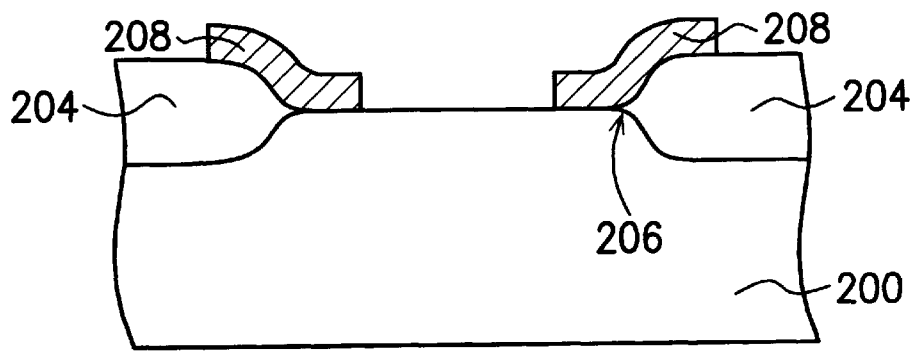
Figure 2C:
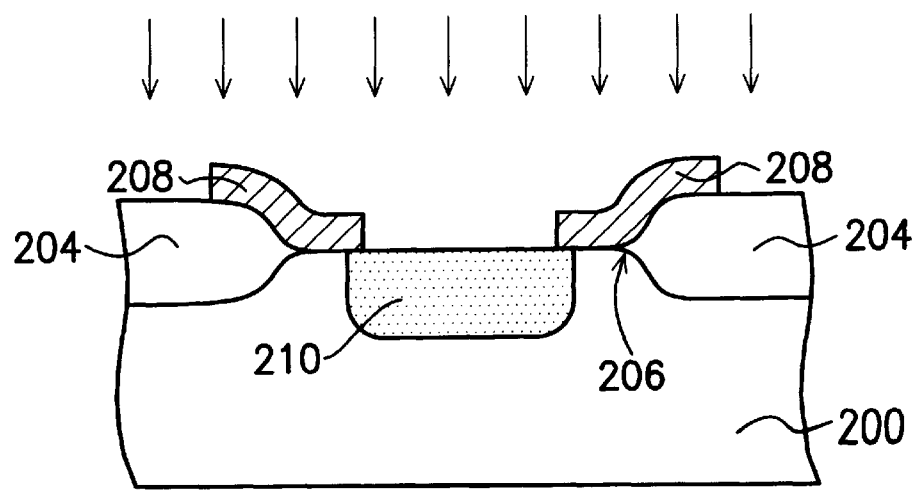

FIGS. 2A through 2C are cross-sectional views showing the progression of manufacturing steps in fabricating a photodiode according to one preferred embodiment of this invention.

First, as shown in FIG. 2A, a patterned silicon nitride layer 202 is formed over a substrate 200. The substrate 200, for example, can be a P-type substrate or the P-well of an N-type substrate. The silicon nitride layer 202 is mainly used as a mask in a local oxidation of silicon (LOCOS) operation. Next, the LOCOS operation is carried out in an atmosphere filled with water vapor to form a field oxide (FOX) layer 204 in the substrate 200. In other words, a wet oxidation is carried out to isolate a device region.

Since water vapor and oxygen cannot easily penetrate a silicon nitride layer, a silicon dioxide is not formed in regions covered by the silicon nitride layer 202. Instead, the field oxide layer 204 only forms in regions not covered by the silicon nitride layer 202. However, water vapor and oxygen still manage to get to the corner region below the silicon nitride layer 202 through horizontal diffusion. Therefore, bird's beaks 206 are able to form in the corner regions. In other words, a portion of the silicon next to the corner region of the silicon nitride layer 202 will be oxidized horizontally to different degrees.

Next, as shown in FIG. 2B, a wet etching method is used to remove the silicon nitride layer 202. Then, a patterned dummy layer 208 is formed over the substrate 200 covering the bird's beak region of the field oxide layer (that is, the transition region between the device region and the isolation region). The patterned dummy layer 208 unctions as a mask, and can be a polysilicon layer or any material that can serve as a barrier layer for the subsequent implantation of N-type ions. By preventing the intrusion of N-type ions into the bird's beak region, large leakage current from that area is avoided.

Next, as shown in FIG. 2C, an ion implantation is performed implanting ions opposite in polarity to the heavily doped P$^+$ substrate 200. That is, the exposed substrate 200 region is heavily implanted using N-type ions to form a heavily doped N$^+$ region 210. For example, the implantation can be carried out using arsenic ions (As$^{75}$) with an energy level of about 100 KeV and a dosage level of about $4.0\times10^{14}/cm^2$. Subsequently, the heavily doped N$^+$ region 210 is annealed to drive the implanted N-type ions deeper into the substrate interior. Consequently, a photodiode device is formed at the junction between the heavily doped N$^+$ region 210 and the substrate 200.

Since a barrier polysilicon layer 208 is formed over the intensive stress regions (the bird's beak regions 206) before the implantation of N-type ions is carried out, the bird's beak region is free from the effect of ion implantation. With very few N-type ions implanted inside the bird's beak region, leakage current is considerably minimized. Furthermore, the barrier polysilicon layer 208 can be retained for other processing operation after the heavily doped N$^+$ region 210 is formed.

In summary, the advantages of this invention include:

1. By forming a barrier polysilicon layer over the bird's beak regions before carrying out the N-type ion implantation, N-type ions are unable to enter the intensive stress bird's beak region. Therefore, the photodiode produced by the method of this invention is able to reduce current leakage.

2. The photodiode is fabricated using standard semiconductor equipment and processes, and hence the invention can be incorporated quite easily into a conventional semiconductor production line.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A photodiode structure having a first conductive type substrate and at least an isolation region, the photodiode structure comprising:

a doped second conductive type region, wherein the doped second conductive type region is formed in the substrate at a distance from the neighboring isolation region; and a mask layer covering at least a peripheral strip near the edge of the isolation region so that only a portion of the substrate is exposed, and the doped second conductive type region is formed in the exposed portion of the substrate.

2. The structure of claim 1, wherein the substrate includes a doped well region.

3. The structure of claim 1, wherein the first conductive type and the second conductive type are doped with ions of the opposite polarity.

4. The structure of claim 1, wherein the second conductive type region is formed by implanting arsenic ions (As$^{75}$) with an energy level of about 100 KeV and a dosage level of about $4.0\times10^{14}/cm^2$.

5. The structure of claim 1, wherein the mask layer includes a polysilicon layer.

6. A photodiode structure having a first conductive type substrate and an isolation region, the photodiode structure comprising:

means for covering at least a peripheral strip near the edge of the isolation region so that only an inner portion of the substrate is exposed, the inner portion being separated from the isolation region by a distance; and a doped second conductive type region formed in the inner portion of the substrate a distance away from the isolation region.

\* \* \* \* \*